(12) United States Patent
Muterspaugh et al.

(10) Patent No.: US 9,479,818 B2
(45) Date of Patent: Oct. 25, 2016

(54) APPARATUS AND METHOD FOR INSERTING ELECTRICAL POWER OR CONTROL SIGNALS INTO A DIPLEXER CIRCUIT

(71) Applicant: THOMSON LICENSING, Issy de Moulineaux (FR)

(72) Inventors: Max Ward Muterspaugh, Westfield, IN (US); Daniel Mark Hutchinson, Carmel, IN (US); Rejimon Gnanammal Varghese, Carmel, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/407,999

(22) PCT Filed: Jun. 18, 2013

(86) PCT No.: PCT/US2013/046216
§ 371 (c)(1),
(2) Date: Dec. 15, 2014

(87) PCT Pub. No.: WO2013/192123
PCT Pub. Date: Dec. 27, 2013

(65) Prior Publication Data
US 2015/0135252 A1    May 14, 2015

Related U.S. Application Data

(60) Provisional application No. 61/660,949, filed on Jun. 18, 2012.

(51) Int. Cl.
*H04N 7/16* (2011.01)
*H04N 21/426* (2011.01)
(Continued)

(52) U.S. Cl.
CPC .............. *H04N 21/426* (2013.01); *H03H 7/46* (2013.01); *H03H 7/466* (2013.01); *H04H 40/90* (2013.01)

(58) Field of Classification Search
CPC ...................................................... H04N 21/61
USPC ......................................................... 725/149
See application file for complete search history.

(56) References Cited

U.S. PATENT DOCUMENTS 5,390,337 A    2/1995  Jelinek et al.
6,304,620 B1   10/2001 Rouphael
(Continued)

FOREIGN PATENT DOCUMENTS

CN    1273710    11/2000
CN    1543066    11/2004
(Continued)

OTHER PUBLICATIONS

WO Search Report dated Aug. 21, 2013.

*Primary Examiner* — Olugbenga Idowu
(74) *Attorney, Agent, or Firm* — Brian J. Dorini; Michael A. Pugel

(57) ABSTRACT

An apparatus and method for applying signals into a filter circuit is disclosed. The apparatus includes a filter circuit that filters an input signal and outputs a signal in a first frequency range, and a filter circuit that filters the input signal and outputs a signal in a second frequency range that is different from the first frequency range, wherein the second filter circuit includes an interface circuit for inserting a signal used to receive the first frequency range signal. The method includes receiving a signal containing content from a first source in a first frequency range and content from a second source in a second frequency range, providing filtering to produce a signal containing the first content, providing filtering to produce a signal containing the second content, and applying a signal to second content signal processing circuitry, the signal provided used for receiving the content from the first source.

18 Claims, 6 Drawing Sheets

(51) Int. Cl.
*H03H 7/46* (2006.01)
*H04H 40/90* (2008.01)

(56) References Cited

U.S. PATENT DOCUMENTS

| | | | |
|---|---|---|---|
| 7,207,054 | B1 | 4/2007 | Richards et al. |
| 7,606,184 | B2 * | 10/2009 | Liu ............... H03H 7/463 370/297 |
| 8,634,029 | B2 | 1/2014 | Pugel |
| 8,670,322 | B2 * | 3/2014 | Yehezkely ............ H04B 7/24 331/74 |
| 2004/0037375 | A1 * | 2/2004 | Cowley ............ H04L 27/0008 375/344 |
| 2006/0020975 | A1 * | 1/2006 | Kenny ............ H04B 10/25751 725/63 |
| 2006/0145782 | A1 | 7/2006 | Liu et al. |
| 2010/0045402 | A1 | 2/2010 | Johansson |
| 2010/0171565 | A1 | 7/2010 | Okada |
| 2011/0255452 | A1 * | 10/2011 | Brooks ............... H04L 12/2801 370/297 |
| 2011/0281543 | A1 | 11/2011 | White et al. |
| 2014/0139046 | A1 * | 5/2014 | Chowdary ............ H02J 7/0055 307/130 |

FOREIGN PATENT DOCUMENTS

| | | |
|---|---|---|
| CN | 101548538 A | 9/2009 |
| EP | 1878242 A2 | 1/2008 |
| EP | 1973272 A1 | 9/2008 |
| EP | 2164192 A3 | 3/2010 |
| JP | 08107326 | 4/1996 |
| JP | 2001094377 | 4/2001 |
| JP | 2007028243 | 2/2007 |
| JP | 2010141859 | 6/2010 |
| WO | WO2006107868 | 10/2006 |
| WO | WO2010087913 | 8/2010 |

* cited by examiner

APPARATUS AND METHOD FOR INSERTING ELECTRICAL POWER OR CONTROL SIGNALS INTO A DIPLEXER CIRCUIT

REFERENCE TO RELATED PROVISIONAL APPLICATION

This application claims the benefit, under 35 U.S.C. §365 of International Application PCT/US2013/046216, filed Jun. 18, 2013, which was published in accordance with PCT Article 21(2) on Dec. 27, 2013 in English and which claims the benefit of U.S. provisional patent application No. 61/660,949, filed Jun. 18, 2012.

TECHNICAL FIELD OF THE INVENTION

The present disclosure generally relates to a communication apparatus that includes circuits for receiving signals from a plurality of sources. More particularly, the present disclosure is related to a diplex filter used in a receiver device that includes a circuit for inserting electrical power for an outdoor unit used to receive a first type of signal, such as a satellite signal, into the portion of the filter used for receiving a second type of signal, such as a cable or terrestrial broadcast signal.

BACKGROUND OF THE INVENTION

This section is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Many home entertainment devices not only include the capability to communicate with other devices in a home network but also include the ability to receive and/or process available media content from a plurality of sources, including a plurality of providers. The sources and providers may include, but are not limited to, satellite service, cable service, and free to home over the air terrestrial service. The services may operate in the same or different frequency ranges and may use the same or different transmission formats or protocols. These devices for receiving the services often include, but are not limited to, set-top boxes, gateways, televisions, home computers, and the like. Further, many of these devices may include multiple interfaces for different types of externally provided services as well as different types of home networks. These devices may also include additional features internal to the device, such as storage elements, hard drives, compact disk or digital versatile disk drives, and the like.

In order to receive signals from these different services simultaneously, a filtering structure, such as a diplex filter, is often used to separate the signals. These filtering structures are particularly important if the services operate in separate frequency ranges and/or use separate transmission formats or protocols. For example, a diplex filter allows the reception of multiple transmission systems, including terrestrial systems complying with Digital Video Broadcasting television standard (DVB-T2) or the Integrated Services Digital Broadcasting television standard (ISDBT) may be included along with reception of satellite signals. A diplex filter is often comprised of a highpass filter for a first high frequency band (e.g., a satellite signal frequency band) and a lowpass filter for a second lower frequency band (e.g., a terrestrial or cable broadcast frequency band). In some designs, a circuit is included for supplying electrical power to external components, such as circuits in an antenna structure. These antenna structures are typically included as part of a satellite receiver outdoor unit and the electrical power is supplied through the satellite circuit and satellite highpass filter.

However, a system receiving multiple signals from multiples services over a wide range of frequencies creates significant difficulties in creating a suitable diplex filter that is also capable of supplying electrical power to a an outdoor unit used for receiving satellite signals. Previous designs did not require the additional diplex filtering functions to receive both terrestrial (e.g., DVB-T2 or ISDBT) broadcasts and satellite signals on a common coaxial cable input. Further, a typical circuit for supplying electrical power may work in the frequency range for the satellite signals but may not work in the frequency range for the terrestrial or cable broadcast signals. Therefore, there is a need for a more optimal filtering structure that allows for reception of multiple signals in separate frequency ranges and includes the ability to provide electrical power to external components.

SUMMARY

According to an aspect of the present disclosure, an apparatus for inserting signals into a filter circuit includes a first filter circuit that filters an input signal and outputs a first output signal that is a portion of the input signal in a first frequency range, and a second filter circuit coupled to the first filter circuit, the second filter circuit filtering the input signal and outputting a second output signal that is a portion of the input signal in a second frequency range, the second frequency range being different than the first frequency range, wherein the second filter circuit includes an interface circuit for inserting a signal that is provided to a device used to receive the portion of the input signal in the first frequency range.

According to an aspect of the present disclosure, a method for applying a signal into a filter circuit includes receiving a signal, the signal containing content from a first source in a first frequency range and content from a second source in a second frequency range, providing filtering, using first processing circuitry, for the received signal to produce a first output signal containing the content from the first source, providing filtering, using second processing circuitry coupled to the first processing circuitry, for the received signal to produce a second output signal containing the content from the second source, and applying a signal to the second processing circuitry, the signal provided used for receiving the content from the first source

BRIEF DESCRIPTION OF THE DRAWINGS

These, and other aspects, features and advantages of the present disclosure will be described or become apparent from the following detailed description of the preferred embodiments, which is to be read in connection with the accompanying drawings.

Figure 1:
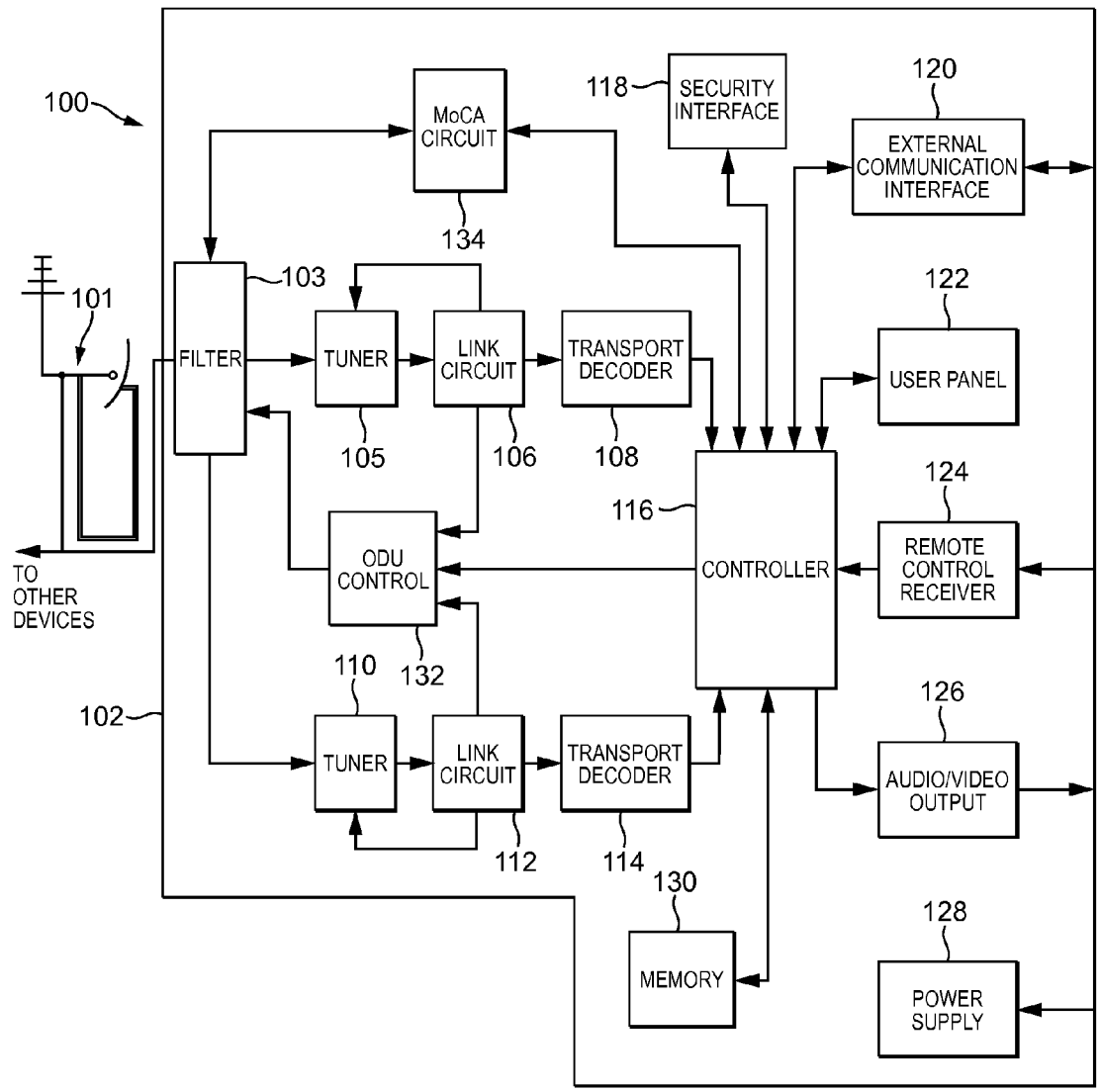
FIG. 1 is a block diagram of an exemplary system for receiving broadcast media content in accordance with the present disclosure.

It should be understood that the drawing(s) are for purposes of illustrating the concepts of the disclosure and is not necessarily the only possible configuration for illustrating the disclosure.

DETAILED DESCRIPTION OF PREFERRED EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The present embodiments are directed at the problem associated with operating a receiving device that is capable of receiving signals from multiple sources or service providers over a wide frequency range. In many receiving device, circuits (e.g., circuits external to the receiving device) associated with receiving the signals from the multiple sources or service providers require electrical power and/or control signals that may be provided from the receiving device. The electrical power and/or control signals may be provided using the existing connections to the receiving device. Providing the electrical power and/or control signals while also simultaneously meeting the operation and performance requirements over the entire frequency range for the received signal in the receiving device may place significant design constraints on an implementation. The components required to supply power and communication or control signals as well as provide overload suppression may introduce undesired characteristics in the frequency response for the filtering circuit, such as undesired resonances. The components may also introduce undesired or parasitic loading on circuitry that may impair the reception of the higher frequency signals. As described below, the filter elements may be repositioned in a manner to isolate the components and the accompanying undesired effects.

The present embodiments describe a method and apparatus for inserting electrical power into a filter circuit. In particular, the embodiments describe a filter circuit design that provides an interface for providing electrical power and/or other communication and control signals to an external device. The electrical power and/or communication and control signals used for operating the external device are provided through the filter circuit to a coaxial cable. The same coaxial cable is also used for delivering a signal containing media program content from multiple services across multiple frequency bands to a receiving device (e.g., satellite broadcast program content and terrestrial or cable broadcast program content). The embodiments describe a filter design used as part of a diplex filter structure. A diplex filter separates the incoming signal into separate signal portions based on the frequency of the signal. The diplex filter further provides electrical power and/or communication and control signals originating in the receiving device to components (e.g., low noise block converters) included in the external device.

The diplex filter described in the embodiments below includes a first portion that is a highpass filter for operation in a first frequency (e.g., satellite L-band frequency) range. The diplex filter includes a second portion that is a bandpass filter for an operation in a second frequency (e.g., television frequency) range. The bandpass filter is further constructed as a combination of a highpass filter and a lowpass filter. The additional insertion circuit for electrical power and communication signals used to operate a circuit associated with the first frequency range is incorporated into a first section of the highpass filter used as part of the bandpass filter for the second frequency range. Further, a portion of the highpass filter may be positioned or electrically coupled in front of the lowpass filter and the remaining portion of the highpass filter positioned or electrically connected following the lowpass filter.

Turning now to the drawings and referring initially to FIG. 1, an exemplary embodiment of a system 100 for receiving signals using aspects of the present invention is shown. System 100 primarily receives signals from one or more satellites as well as multiple television broadcast transmission sites. The signals are provided by one or more service providers and represent broadcast audio and video programs and content. System 100 is described as including components that reside both inside and outside a user's premises. It is important to note that one or more components in system 100 may be moved from inside to outside the premises. Further, one or more components may be integrated with a display device, such as a television or display monitor (not shown). In either case, several components and interconnections necessary for complete operation of system 100 are not shown in the interest of conciseness, as the components not shown are well known to those skilled in the art.

An outdoor unit (ODU) 101 receives signals from satellites and from terrestrial transmission towers through an over the air and/or near earth orbit communications link. ODU 101 is connected to set top box 102. Within set top box 102, the input is connected to filter 103. Filter 103 connects to three signal processing paths. A first path includes tuner 105, link circuit 106, and transport decoder 108 connected together serially. A second path includes tuner 110, link circuit 112, and transport decoder 114 connected together serially. A third path includes Multimedia over Cable Alliance (MoCA) circuit 134 which further connects to controller 116. The outputs of transport decoder 108 and transport decoder 114 each connect to controller 116. Controller 116 connects to security interface 118, external communication interface 120, user panel 122, remote control receiver 124, audio/video output 126, power supply 128, memory 130, and ODU control 132. External communication interface 120, remote control receiver 124, audio/video output 126, and power supply 128 provide external interfaces for the set top box 102. ODU control 132 also connects to the filter 103.

Satellite signal streams, each containing a plurality of channels, are received by ODU 101. ODU 101 includes a dish for capturing and focusing the propagated radio wave from the atmosphere onto one or more antennas contained within a structure known as a low noise block converter (LNB). ODU 101 may be configured to receive the signal streams from satellite transponders located on one or more satellites. In a preferred embodiment, two sets of sixteen channels are received by ODU 101, and converted, using one or more LNBs to a frequency range of 950 Megahertz (MHz) to 2,150 MHz, referred to as L-band. ODU 101 also includes a terrestrial antenna for receiving over the air broadcasts. In a preferred embodiment, ODU 101 includes a multiple element antenna array for receiving ISDBT signals in the frequency range from 170 MHz to 800 MHz.

ODU 101 provides a converted signal stream to the set top box 102 through radio frequency (RF) co-axial cable. The converted signal stream is provided to filter 103. The frequency response properties of filter 103 include a separate highpass filter and lowpass filter such that the frequency passbands of each do not overlap. The arrangement, often referred to as a diplexer or diplex filter, allows for a separation, through signal filtering, of the incoming satellite signal and/or MoCA signal from the terrestrial signal and/or MoCA signal. In a preferred embodiment, the lowpass filter frequency response passband ends at a frequency below 900 MHz. The lowpass filter portion allows a terrestrial signal or other signals in the frequency range from 170 MHz to 800 MHz to pass through to subsequent blocks while attenuating, or not passing through, a satellite signal and/or MOCA signal in a frequency range from 950 MHz to 2,150 MHz. The highpass filter portion operates in an opposite manner passing the MoCA signal, in the frequency range around 1100 MHz, along with the satellite signal through and attenuating cable or terrestrial broadcast signal. The filter 103 may also filter any electrical supply or communication signals provided to the ODU 101 from other circuits in set top box 102. Filter 103 may also include surge or transient voltage protection devices. An additional filter circuit (not shown) may be provided to further process the MoCA signal and provide this signal as an output.

The output signal from the highpass filter portion of filter 103 is provided to a first signal path containing a tuner 105, a link circuit 106, and a transport decoder 108 connected in a serial fashion. The output signal from the lowpass filter portion of the filter 103 is provided to a second signal path. The second signal path also contains a tuner 110, a link circuit 112, and a transport decoder 114 connected in a serial fashion. Each processing path may perform similar processing on the filtered signal streams, the processing being specific to the transmission protocol used.

Tuner 105 processes the split signal stream by selecting or tuning one of the channels provided from a satellite service provider in the highpass filtered signal stream to produce one or more baseband signals. Tuner 105 contains circuits (e.g., amplifiers, filters, mixers, and oscillators) for amplifying, filtering and frequency converting the satellite signal stream. Tuner 105 typically is controlled or adjusted by link circuit 106. Alternately, tuner 105 may be controlled by another controller, such as controller 116, which will be described later. The control commands include commands for changing the frequency of an oscillator used with a mixer in tuner 105 to perform the frequency conversion.

Tuner 110 processes the lowpass filtered signal stream by selecting or tuning one of the terrestrial or cable broadcast channels in the split signal stream to produce one or more baseband signals. Tuner 110 contains circuits (e.g., amplifiers, filters, mixers, and oscillators) for amplifying, filtering and frequency converting the signal stream. Tuner 110 may controlled or adjusted in a manner similar to that described earlier for tuner 105.

Typically the baseband signals at the output of tuner 105 or tuner 110 may collectively be referred to as the desired received signal and represent one satellite channel selected out of a group of channels that were received as the input signal stream. Although the signal is described as a baseband signal, this signal may actually be positioned at a frequency that is only near to baseband.

The one or more baseband signals from the satellite service provider are provided to link circuit 106 through tuner 105. Link circuit 106 typically contains the processing circuits needed to convert the one or more baseband signals into a digital signal for demodulation by the remaining circuitry of link circuit 106. In one embodiment the digital signal may represent a digital version of the one or more baseband signals. In another embodiment the digital signal may represent the vector form of the one or more baseband signals. Link circuit 106 also demodulates and performs error correction on the digital signal from the satellite service provider to produce a transport signal. The transport signal may represent a data stream for one program, often referred to as a single program transport streams (SPTS), or it may represent multiple program streams multiplexed together, referred to as a multiple program transport stream (MPTS).

The one or more baseband signals from the broadcast service provider are provided to link circuit 112 through tuner 110. Link circuit 112 typically contains the processing circuits needed to convert the one or more baseband signals into a digital signal for demodulation by the remaining circuitry of link circuit 112 in a manner similar to link circuit 106 described earlier. Link circuit 112 also demodulates, performs broadcast channel equalization error correction on the digital signal from the broadcast service provider to produce a transport signal. As described earlier, the transport signal may represent a data stream for one program or it may represent multiple program streams multiplexed together.

The transport signal from link circuit 106 is provided to transport decoder 108. Transport decoder 108 typically separates the transport signal, which is provided as either a SPTS or MPTS, into individual program streams and control signals. Transport decoder 108 also decodes the program streams, and creates audio and video signals from these decoded program streams. In one embodiment, transport decoder 108 is directed by user inputs or through a controller such as controller 116 to decode only the one program stream that has been selected by a user and create only one audio and video signal corresponding to this one decoded program stream. In another embodiment, transport decoder 108 may be directed to decode all of the available program streams and then create one more audio and video signals depending on user request.

The transport signal from link circuit 112 is similarly provided to transport decoder 114. Transport decoder 114 decodes the program streams, and creates audio and video signals from these decoded program streams as directed by user inputs or a controller in a manner similar to that described earlier for transport decoder 108.

The audio and video signals, along with any necessary control signals, from both transport decoder 108 and transport decoder 114 are provided to controller 116. Controller 116 manages the routing and interfacing of the audio, video, and control signals and, further, controls various functions within set top box 102. For example, the audio and video signals from transport decoder 108 may be routed through controller 116 to an audio/video (A/V) output 126. A/V output 126 supplies the audio and video signals from set top box 102 for use by external devices (e.g., televisions, display monitors, and computers). Also, the audio and video signals from transport decoder 114 may be routed through controller 116 to memory block 130 for recording and storage.

Memory block 130 may contain several forms of memory including one or more large capacity integrated electronic memories, such as static random access memory (SRAM), dynamic RAM (DRAM), or hard storage media, such as a hard disk drive or an interchangeable optical disk storage system (e.g., compact disk drive or digital video disk drive). Memory block 130 may include a memory section for storage of instructions and data used by controller 116 as well as a memory section for audio and video signal storage. Controller 116 may also allow storage of signals in memory block 130 in an alternate form (e.g., an MPTS or SPTS from transport decoder 108 or transport decoder 114).

Controller 116 is also connected to an external communications interface 120. External communication interface 120 may provide signals for establishing billing and use of the service provider content. External communications interface 120 may include a phone modem for providing phone connection to a service provider. External communications interface 120 may include an interface for connection to an Ethernet network and/or to home wireless communications network. The Ethernet network and/or home wireless network may be used for communication data, audio, and/or video signals and content to and from other devices connected to the Ethernet network and/or home wireless network (e.g., other media devices in a home).

Controller 116 also connects to a security interface 118 for communicating signals that manage and authorize use of the audio/video signals and for preventing unauthorized use. Security interface 118 may include a removable security device, such as a smart card. User control is accomplished through user panel 122, for providing a direct input of user commands to control the set top box and remote control receiver 124, for receiving commands from an external remote control device. Although not shown, controller 116 may also connect to the tuners 105, 110, link circuits 106, 112, and transport decoders 108, 114 to provide initialization and set-up information in addition to passing control information between the blocks. Finally, power supply 128 typically connects to all of the blocks in set top box 102 and supplies the power to those blocks as well as providing power to any of the elements needing power externally, such as the ODU 101.

Controller 116 also controls ODU control 132. ODU control 132 provides signaling and power supply electrical power back to the ODU 101 through filter 103. ODU control 132 provides these signals and power onto the co-axial cable(s) running between ODU 101 and set top box 102. In one embodiment, the ODU control 132 receives input control signals from controller 116 and provides different direct current (DC) voltage levels to specific portions of the ODU 101 to provide a certain signal stream containing a set of programs or content to filter 103 and further to tuner 105 and tuner 110. In another embodiment, the ODU control 132 receives inputs from controller 116 and also from link circuit 106 and link circuit 112 and provides DC voltage levels and a separate tuning control signal to ODU 101 using low frequency carrier based frequency shift keying modulation. Controller 116 also may send control commands to disable ODU controller 130 from providing either DC voltages or control signals or both to ODU 101.

MoCA circuit 134 amplifies and processes the MoCA signal both for reception and transmission. As described above the MoCA interface permits communications of audio and video signals in a home network and may operate bi-directionally. MoCA circuit 134 includes a low noise amplifier for improving reception performance of a MoCA signal received by signal receiving device 100 from another network connected device. The received and amplified signal is tuned, demodulated, and decoded. The decoded signal may be provided to a number of other circuits, including audio and video outputs as well as a mass storage device (e.g., hard disk drive, optical drive, and the like), not shown. Additionally, MoCA circuit 134 generates and formats the MoCA transmit signal using audio and video content available in signal receiving device, including content received from the input (e.g., satellite signal) and content from the mass storage device. MoCA circuit 134 also includes a power amplifier for increasing the transmitted signal level of the MoCA signal sent by signal receiving device 100 to another network connected device. Adjustment of the receive signal amplification as well as the transmit signal amplification in MoCA circuit 134 may be controlled by controller 116.

It should be appreciated by one skilled in the art that the blocks described inside set top box 102 have important interrelations, and some blocks may be combined and/or rearranged and still provide the same basic overall functionality. For example, transport decoder 108 and transport decoder 114 may be combined and further integrated along with some or all of the functions of controller 116 into a System on a Chip (SoC) that operates as the main controller for set top box 102. Further, control of various functions may be distributed or allocated based on specific design applications and requirements. As an example, link circuit 106 may provide control signals to ODU control 132 and no connection may exist between link circuit 112 and ODU control 132.

Further, it should be appreciated that although ODU 101 includes both a dish and LNB for use with satellite signals and a terrestrial antenna, other embodiments may use separate structures. In some embodiments, the satellite dish and LNB are included in one structure and the terrestrial antenna is part of a second structure. The outputs of both satellite dish/LNB structure and terrestrial antenna are combined using a signal combining circuit and provided to set top box 102.

Although set top box 102 is described above as receiving a single converted signal stream, set top box 102 may also be configured to receive two or more separate converted signal streams supplied by ODU 101 in some modes of operation. Operation in these modes may include additional components including switches and/or further tuning and signal receiving components, not shown. Further, set top box 102 may be designed to operate only on a home network using the Ethernet or home wireless network interfaces described above. In this case, the elements associated with operation in a MoCA network may be removed from set top box 102.

As described earlier, outdoor antenna elements that receive satellite signals, such as ODU 101, include circuits such as low noise block converters (LNBs) that require as much as 15 watts of electrical power. These circuits may also use low frequency control signals generated by controller 116 and provided through ODU 132 and filter 103. The control signals may be used for selecting operating parameters, such as polarization or selecting different feeds from a parabolic reflector. The power and the control signals are typically multiplexed onto the center conductor of a coaxial cable that also provide the frequency converted satellite signals. The components used to supply the electrical power must be capable of carrying the current necessary to power ODU 101. Further, the components may be subjected to electro static discharges (ESD) as well as higher energy surges (surge) due to nearby lightning strikes. These conditions require that circuitry, including circuitry used in filter 103, provide protection devices for ESD as well as high current capability.

In a settop box, such as settop box 102, the electrical power and control signal may be multiplexed onto the co-axial cable through an inductive component, referred to as an RF choke. The RF choke component must withstand the ESD and surge without damage, requiring the use of large gauge electrical wire in its construction. The large gauge wire introduces stray capacitance and an undesirable self-resonance in the RF choke that can sharply attenuate signals near the self-resonance. In order to place this self-resonance above the operating frequency range (e.g., 2,150 MHz), empirical calculation has determined that an electrical inductance value of 68 nanohenries (nH) or less for the RF choke may be necessary. The impedance created by an RF choke with an electrical value equal to 68 nH over the operating frequency range is acceptable for passing the satellite broadcast signals and maintaining performance of the set top box.

However, a system that also receives terrestrial broadcast signals between 170 and 806 MHz creates additional difficulties for operation of the set top box. The relatively low impedance value created by an RF choke with a value of 68 nH significantly attenuates the broadcast signal frequency range. In order to address this problem, filter 103 may include a circuit that includes an inductor that serves as the RF choke for supplying electrical power and/or communication and control signals for the satellite portion of an ODU (e.g., ODU 101) that is further incorporated into the design of the filter used for the terrestrial broadcast signals. Further details regarding the design of this filter are described below.

Figure 2:
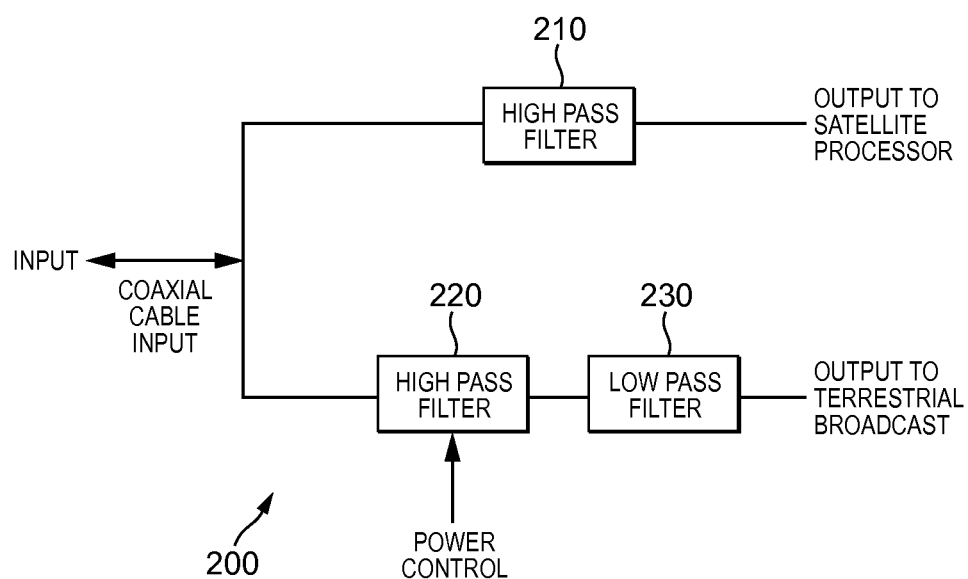
FIG. 2 is a block diagram of an exemplary diplex filter in accordance with the present disclosure.

Turning to FIG. 2, a block diagram of a diplex filter 200 used in a receiving device according to aspects of the present disclosure is shown. Diplex filter 200 may operate in a manner similar to filter 103 described in FIG. 1.

Diplex filter 200 includes highpass filter 210 and highpass filter 220 connected to an input connector. The output of highpass filter 210 is provided to other circuits for receiving satellite signals (e.g., tuner 105 described in FIG. 1). The output of highpass filter 220 is connected to lowpass filter 230. The output of lowpass filter 230 is provided to other circuits for receiving terrestrial or cable broadcast signals (e.g., tuner 110 described in FIG. 1). Highpass filter 220 also receives an input for electrical power and communication signals for operating an external device associated with receiving the satellite signals (e.g., ODU 101 described in FIG. 1).

The received signal at the input to diplexer 200 includes both satellite and broadcast signals. Highpass filter 210 passes satellite signals with frequencies above 950 MHz for satellite signal processing. The broadcast signals are filtered through the series structure of highpass filter 220 and lowpass filter 230. The structure forms a bandpass filter comprised of highpass filter 220 with a cut off frequency of 170 MHz and lowpass filter 230 with a cut off frequency of 806 MHz. Diplex filter 200 includes the connection for the electrical power and communication to the external outdoor receiving unit for the satellite signals as part of highpass filter 220 instead of highpass filter 210 overcomes the drawbacks discussed earlier in interfacing electrical power for external devices in a multiplexing filter structure.

Figure 3:
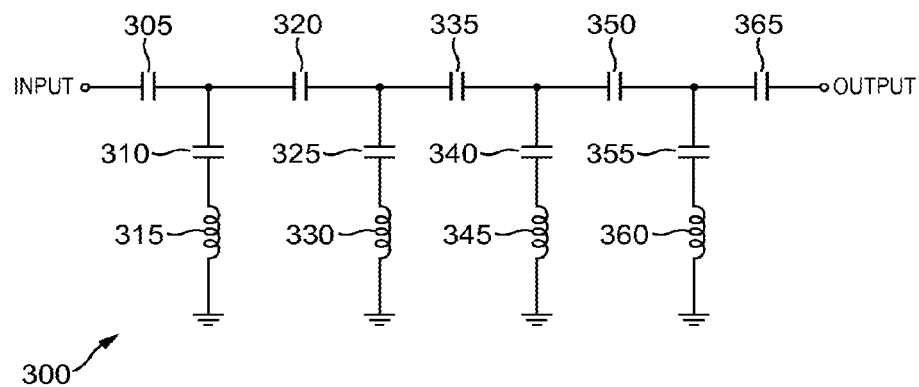
FIG. 3 is a circuit diagram of an exemplary highpass filter used in a diplex filter in accordance with the present disclosure.

Turning to FIG. 3, a circuit diagram for an exemplary embodiment for a highpass filter 300 used in a diplex filter according to aspects of the present disclosure is shown. Highpass filter 300 may operate in a manner similar to the highpass filter section for filtering satellite signals used in a diplex filter (e.g., highpass filter 210 used in diplexer 200 described in FIG. 1 or filter 103 described in FIG. 1).

In highpass filter 300, the input is provided to one end of element 305. The other end of element 305 connects to one end of both element 310 and element 320. The other end of element 310 further connects to one end of element 315. The other end of element 315 connects to ground. The other end of element 320 connects to one end of both element 325 and element 335. The other end of element 325 further connects to one end of element 330. The other end of element 330 connects to ground. The other end of element 335 connects to one end of both element 350 and element 340. The other end of element 340 further connects to one end of element 345. The other end of element 345 connects to ground. The other end of element 350 connects to one end of both element 355 and element 365. The other end of element 355 further connects to one end of element 360. The other end of element 360 connects to ground. The other end of element 365 provides an output signal for highpass filter 300.

Highpass filter 300 receives the input signal and filters, or passes, the portion of the signal containing media content channels supplied from a satellite broadcast service provider. Highpass filter 300 attenuates, or prevents, the portion of the signal typically containing media content channels supplied from a terrestrial broadcast service provider. In one embodiment, highpass filter 300 has a filter cutoff frequency equal to 950 MHz. In a preferred embodiment, highpass filter 300 is a $9^{th}$ order elliptic type filter design. Elliptic type filters are suitable for providing good attenuation for frequencies relatively closely spaced to the cut off frequency, a frequency between the passband and the stopband of the filter. However, Butterworth, Chebyshev or other filter types may be employed for systems having different requirements.

The following table shows values for one exemplary embodiment of highpass filter 300.

TABLE 1

| ELEMENT | VALUE |
|---|---|
| 305 | 1.8 picofarads |
| 310 | 5.1 picofarads |
| 315 | 11 nanohenries |
| 320 | 2.2 picofarads |
| 325 | 2.7 picofarads |
| 330 | 14 nanohenries |
| 335 | 3 picofarads |
| 340 | 1.2 picofarads |
| 345 | 30 nanohenries |
| 350 | 3 picofarads |
| 355 | 12 picofarads |
| 360 | 13 nanohenries |
| 365 | 5.6 picofarads |

Figure 4:
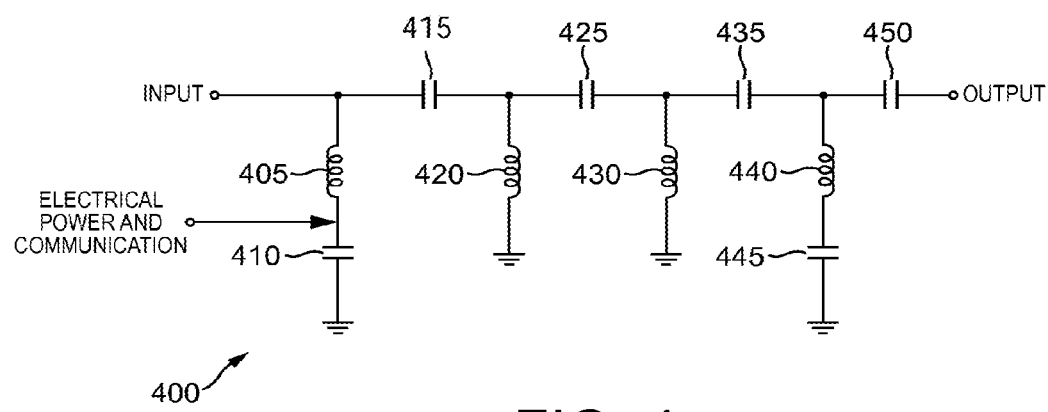
FIG. 4 is a circuit diagram of another exemplary highpass filter used in a diplex filter in accordance with the present disclosure.

Turning to FIG. 4, a circuit diagram for an exemplary embodiment for a highpass filter 400 used in a diplex filter according to aspects of the present disclosure is shown. Highpass filter 400 may be included in a filter section for filtering terrestrial and cable broadcast signals used in a diplex filter (e.g., highpass filter 220 used in diplexer 200 described in FIG. 1 or filter 103 described in FIG. 1).

In highpass filter 400, the input is provided to one end of both element 405 and element 415. The other end of element 405 further connects to one end of element 410. The other end of element 410 connects to ground. The other end of element 415 connects to one end of both element 420 and element 425. The other end of element for 420 connects to ground. The other end of element 425 connects to one end of both element 430 and element 435. The other end of element 430 connects to ground. The other end of element 435 connects to one end of both element 440 and element 450. The other end of element 440 further connects to one end of element 445. The other end of element 445 connects to ground. The other end of element 450 provides an output signal for highpass filter 400. Electrical power and/or communication and control signals are provided to the connection point between element 405 and element 410.

Highpass filter 400 receives the input signal and filters, or passes, the portion of the signal typically containing media content channels supplied from a terrestrial broadcast service provider. Highpass filter 400 will also filter, or pass, the portion of the signal typically containing media content channels supplied from a satellite broadcast service provider. Although the passing of the portion of the signal containing media content channels from the satellite broadcast service provider may be undesirable in this portion of the diplexer, a subsequent filter, such as lowpass filter 230 described in FIG. 2 or the filter described below will attenuate or prevent these signals from passing to the terrestrial broadcast receiving circuits. Highpass filter 400 attenuates, or prevents, the portion of the signal below the frequency range containing media content channels supplied from the terrestrial broadcast service provider. The attenuation of signals below 170 MHz prevents interference with operation of receiving circuits from other communication networks, including the control signal for an outdoor unit (e.g., ODU 101 described in FIG. 1). In one embodiment, highpass filter 400 has a filter cutoff frequency equal to 170 MHz. In a preferred embodiment, highpass filter 400 is a modified $8^{th}$ order Chebyshev filter type design. Element 445 is added in series with inductor 440 to form a series resonant frequency response. The series resonant frequency response prevents interference from undesired signals by providing attenuation of signals in the FM broadcast frequency range (e.g., 88 MHz to 108 MHz).

The following table shows values for one exemplary embodiment of highpass filter 400.

TABLE 2

| ELEMENT | VALUE |
|---|---|
| 405 | 47 nanohenries |
| 410 | 220 picofarads |
| 415 | 22 picofarads |
| 420 | 33 nanohenries |
| 425 | 9.1 picofarads |
| 430 | 27 nanohenries |
| 435 | 10 picofarads |
| 440 | 47 nanohenries |
| 445 | 51 picofarads |
| 450 | 30 picofarads |

As described above, an RF choke is used to provide electrical power and/or communication and control signals to one or more external devices. Typically, a solution includes selecting the electrical value for element 410 that provides a low impedance above 170 MHz and a relatively high impedance for the power and control signals at 2.3 MHz and below. The value of element 405, which serves as the RF choke for providing electrical power and control signals, may be chosen to both be a suitable inductance value for use in highpass filter 400 as well as having a self resonant frequency above 2,150 MHz along with the required power surge and ESD suppression capability. Additional circuitry for ESD and power surge suppression may also be placed at the junction of element 405 and element 410. The electrical value for element 415 may be chosen as a large value capacitance. However, in a preferred embodiment, the value for element 415 is chosen as a component of the filter.

Figure 5:
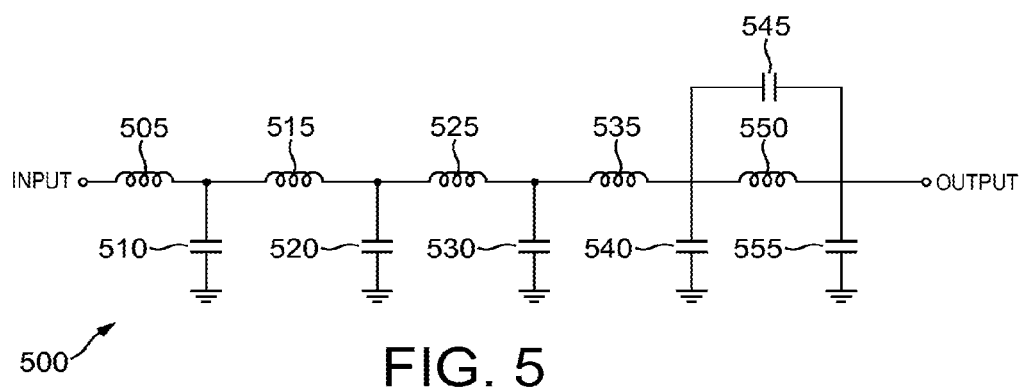
FIG. 5 is a circuit diagram of an exemplary lowpass filter used in a diplex filter in accordance with the present disclosure.

Turning to FIG. 5, a circuit diagram for an exemplary embodiment for a lowpass filter 500 used in a diplex filter according to aspects of the present disclosure is shown. Lowpass filter 500 may be included in a filter section for filtering terrestrial and cable broadcast signals used in a diplex filter (e.g., lowpass filter 230 used in diplexer 200 described in FIG. 1 or filter 103 described in FIG. 1).

In lowpass filter 500, the input is provided to one end of element 505. The other end of element 505 is connected to one end of both element 510 and element 515. The other end of element 510 connects to ground. The other end of element 515 connects to one end of both element 520 and element 525. The other end of element 520 connects to ground. The other end of element 525 connects to one end of both element 530 and element 535. The other end of element 530 connects to ground. The other end of element 535 connects to one end of element 540 and to one end of elements 545 and 550 arranged in parallel. The other end of element 540 connects to ground. The other ends of elements 545 and 550 further connect to one end of element 555 and provide an output signal for lowpass filter 500. The other end of element 555 connects to ground.

Lowpass filter 500 receives the input signal and filters, or passes, the portion of the signal typically containing media content channels supplied from a terrestrial broadcast service provider. Lowpass filter 500 attenuates, or prevents, the portion of the signal typically containing media content channels supplied from a satellite broadcast service provider. In one embodiment, lowpass filter 500 has a filter cutoff frequency equal to 806 MHz. In a preferred embodiment, lowpass filter 500 a $10^{th}$ order Chebyshev type filter design with a modified section that adds element 545. The addition of element 545 provides additional signal attenuation or rejection in the stopband potion of the frequency response.

The following table shows values for one exemplary embodiment of lowpass filter 500.

TABLE 3

| ELEMENT | VALUE |
|---|---|
| 505 | 22 nanohenries |
| 510 | 4.7 picofarads |
| 515 | 27 nanohenries |
| 520 | 5.0 picofarads |
| 525 | 27 nanohenries |
| 530 | 5.0 picofarads |
| 535 | 22 nanohenries |
| 540 | 4.3 picofarads |
| 545 | 2.7 picofarads |
| 550 | 9.1 nanohenries |
| 555 | 1.8 picofarads |

A diplex filter, such as diplex filter 200, may be comprised of the filter components and circuits described in FIGS. 3-5. However, in some embodiments, components in highpass filter 220 or highpass filter 400 may affect the performance and operation of highpass filter 210 or highpass filter 300 when connected as shown in FIG. 2. For example, elements 420, 425, 430, 435, 440, 445, and 450 may add stray capacitance to ground as well as undesirable self resonant frequency characteristics that may degrade operation and performance in the frequency range for the signal in the satellite frequency range (e.g., 950 MHz to 2,150 MHz). In order to further overcome these shortcomings, the elements in highpass filter 220 or highpass filter 300 may be separated into two portions with a first portion placed before lowpass 230 or lowpass filter 500 and a second portion placed after lowpass filter 230 or lowpass filter 500. For example, the elements used for providing the electrical power and control signals may be located at the front of lowpass filter 230 or lowpass filter 500. The remaining components in the highpass filter 220 or highpass filter 400 may be added in series after lowpass filter 230 or lowpass filter 500 without degradation of the filter response for the combined filter.

Figure 6:
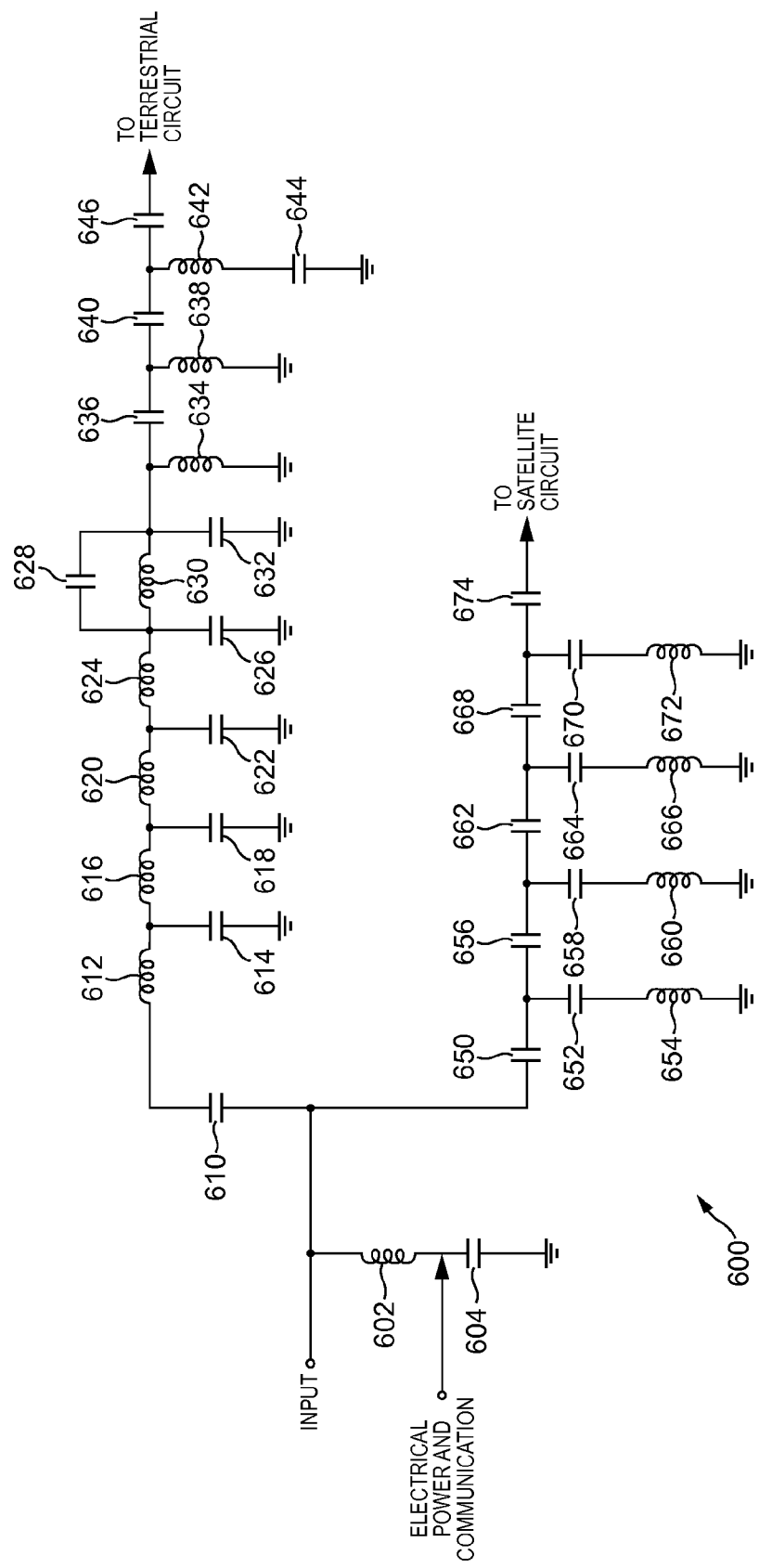
FIG. 6 is a circuit diagram of an exemplary diplex filter in accordance with the present disclosure.

Turning to FIG. 6, a circuit diagram of a diplex filter 600 used in a receiving device according to aspects of the present disclosure is shown. Diplex filter 600 may operate in a manner similar to filter 103 described in FIG. 1 as well as diplex filter 200 described in FIG. 2. Diplex filter 600 may be comprised of filter elements similar to those described in FIGS. 3-5 and may further address issues related to operational and performance effects caused by interaction between the filters used to receive the satellite and terrestrial broadcast portions of the signal.

In diplex filter 600, the input is provided to one end of element 602. The other end of element 602 further connects to one end of element 604. The other end of element 604 connects to ground. The input is also provided to one end of element 610. The other end of element 610 further connects to one end of element 612. The other end of element 612 is connected to one end of both element 614 and element 616. The other end of element 614 connects to ground. The other end of element 616 connects to one end of both element 618 and element 620. The other end of element 618 connects to ground. The other end of element 620 connects to one end of both element 622 and element 624. The other end of element 622 connects to ground. The other end of element 624 connects to one end of element 626 and also connects to one end of elements 628 and 630 arranged in parallel. The other end of element 626 connects to ground. The other ends of elements 628 and 630 further connect to one end of element 632 and element 634 arranged in parallel and also connect to one end of element 636. The other ends of element 632 and element 634 connect to ground. The other end of element 636 connects to one end of both element 638 and element 640. The other end of element 638 connects to ground. The other end of element 640 connects to one end of both element 642 and element 646. The other end of element 642 connects to one end of element 644. The other end of element 644 connects to ground. The other end of element 646 provides an output for use with additional terrestrial television receiving circuits. The connection between element 602 and element 604 also serves as the interface for connecting electrical power and/or communication or control signals for use by an external device.

The received signal is also provided to one end of element 650. The other end of element 650 further connects to one end of both element 652 and element 656. The other end of element 652 further connects to one end of element 654. The other end of element 654 connects to ground. The other end of element 656 connects to one end of both element 658 and element 662. The other end of element 658 further connects to one end of element 660. The other end of element 660 connects to ground. The other end of element 662 connects to one end of both element 664 and element 668. The other end of element 664 further connects to one end of element 666. The other end of element 666 connects to ground. The other end of element 668 connects to one end of both element 670 and element 674. The other end of element 670 further connects to one end of element 672. The other end of element 672 connects to ground. The other end of element 674 provides an output for use with additional satellite broadcast receiving circuits.

As described earlier, elements associated with the highpass filter for signals in the terrestrial broadcast signal frequency range may add stray capacitance and undesirable self resonances that degrade operation and performance in the satellite broadcast signal range of frequencies. The filter structure in diplex filter 600 addresses these issues by placing some of the elements used in the highpass filter before the lowpass filter elements and the remaining elements used in the highpass filter after the lowpass filter elements. The placement of the circuit elements described in diplex filter 600 may be used to achieve a desirable isolation, especially from these stray capacitance loading and/or undesirable stray resonances. In particular, this placement isolates some of the components used in the highpass filter from the relatively high frequency satellite signals present at the junction with the highpass filter used for the satellite signal portion of the received signal and terrestrial signal portion of the received signal. The placement still allows the elements in the highpass filter used for the terrestrial broadcast signal portion of the signal to be located at or near the input in order to provide an insertion point for electrical power and/or low frequency communication or control signals associated with receiving the satellite broadcast signal.

The following table shows values for one exemplary embodiment of diplex filter 600.

TABLE 4

| ELEMENT | VALUE |
|---|---|
| 602 | 47 nanohenries |
| 604 | 220 picofarads |
| 610 | 22 picofarads |
| 612 | 22 nanohenries |
| 614 | 4.7 picofarads |
| 616 | 27 nanohenries |
| 618 | 5.0 picofarads |
| 620 | 27 nanohenries |
| 622 | 5.0 picofarads |
| 624 | 22 nanohenries |
| 626 | 4.3 picofarads |
| 628 | 2.7 picofarads |
| 630 | 9.1 nanohenries |
| 632 | 1.8 picofarads |
| 634 | 33 nanohenries |
| 636 | 9.1 picofarads |
| 638 | 27 nanohenries |
| 640 | 10 picofarads |
| 642 | 47 nanohenries |
| 644 | 51 picofarads |
| 646 | 30 picofarads |
| 650 | 1.8 picofarads |
| 652 | 5.1 picofarads |
| 654 | 11 nanohenries |
| 656 | 2.2 picofarads |
| 658 | 2.7 picofarads |
| 660 | 14 nanohenries |
| 662 | 3 picofarads |
| 664 | 1.2 picofarads |
| 666 | 30 nanohenries |
| 668 | 3.0 picofarads |
| 670 | 12 picofarads |
| 672 | 13 nanohenries |
| 674 | 5.6 picofarads |

Figure 7:
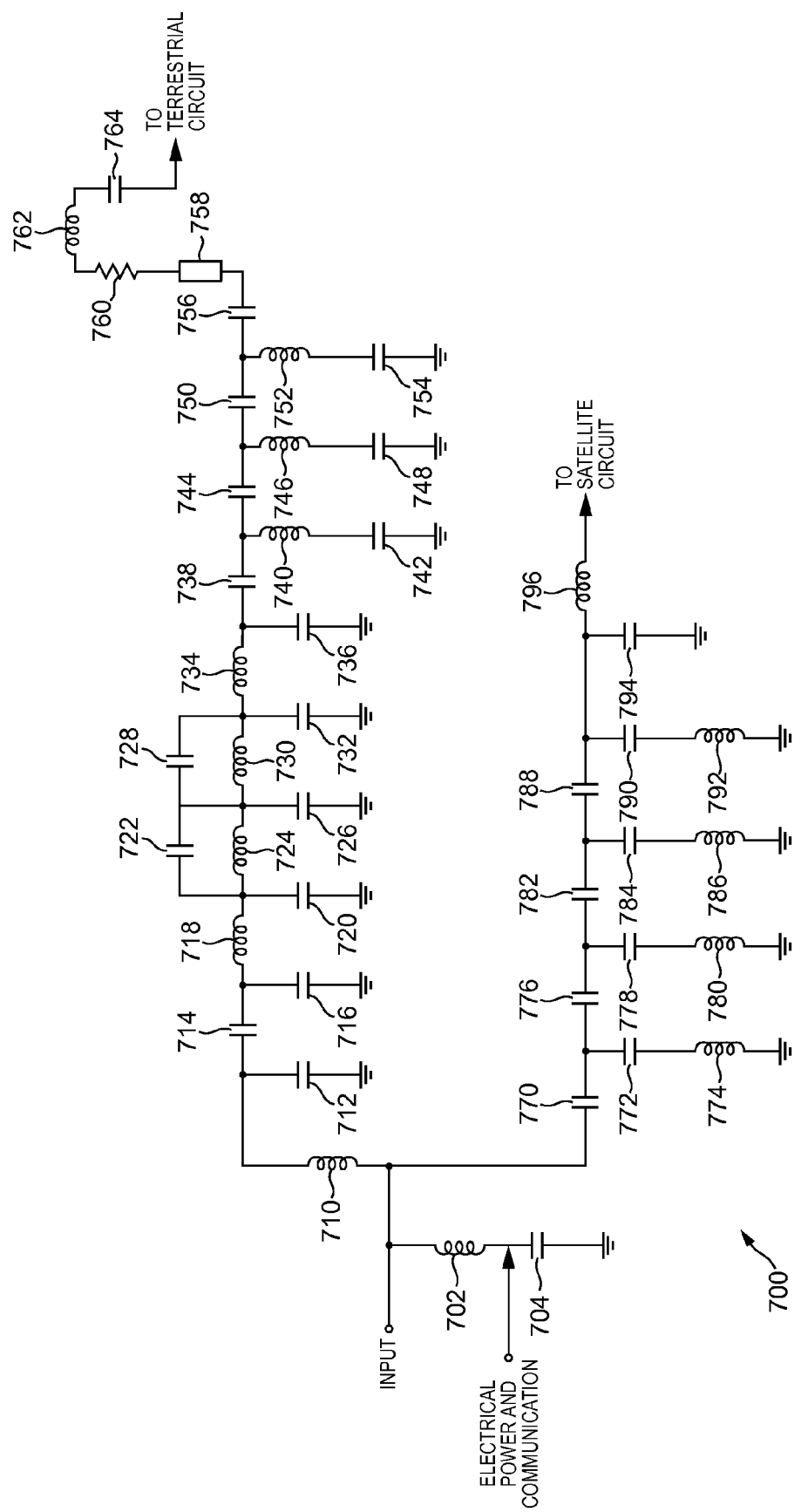
FIG. 7 is a circuit diagram of another exemplary diplex filter in accordance with the present disclosure.

Turning to FIG. 7, a circuit diagram of a diplex filter 700 used in a receiving device according to aspects of the present disclosure is shown. Diplex filter 700 operates in a manner similar to diplex filter 600 described in FIG. 6 as well as diplex filter 200 described in FIG. 2 and filter 103 described in FIG. 1. Diplex filter 700 may be comprised of filter elements similar to those described in FIGS. 3-5 and also addresses issues related to operational and performance effects caused by interaction between the filters used to receive the satellite and terrestrial broadcast portions of the signal.

In diplexer 700, the input is provided to one end of element 702. The other end of element 702 further connects to one end of element 704. The other end of element 704 connects to ground. The input is also provided to one end of element 710. The other end of element 610 is connected to one end of both element 712 and element 714. The other end of element 712 connects to ground. The other end of element 714 connects to one end of both element 716 and element 718. The other end of element 716 connects to ground. The other end of element 718 connects to one end of element 720 and also connects to one end of elements 722 and 724 arranged in parallel. The other end of element 720 connects to ground. The other ends of elements 722 and 724 connect to one end of element 726 and also connect to one end of elements 728 and 730 arranged in parallel. The other end of element 726 connects to ground. The other ends of elements 728 and 730 further connect to one end of both element 732 and element 734. The other end of element 732 connects to ground. The other end of element 734 connects to one end of both element 736 and element 738. The other end of element 736 connects to ground. The other end of element 738 connects to one end of both element 740 and element 744. The other end of element 740 connects to one end of element 742. The other end of element 742 connects to ground. The other end of element 744 connects to one end of both element 746 and element 750. The other end of element 746 connects to one end of element 748. The other end of element 748 connects to ground. The other end of element 750 connects to one end of both element 752 and element 756. The other end of element 752 connects to one end of element 754. The other end of element 754 connects to ground. The other end of element 756 connects to one end of element 758. The other end of element 758 connects to one end of element 760. The other end of element 760 connects to one end of element 762. The other end of element 762 connects to one end of element 764. The other end of element 764 provides an output for use with additional terrestrial television receiving circuits. The connection between element 602 and element 604 also serves as the interface for connecting electrical power and/or communication or control signals for use by an external device.

The received signal is also provided to one end of element 770. The other end of element 770 further connects to one end of both element 772 and element 776. The other end of element 772 further connects to one end of element 774. The other end of element 774 connects to ground. The other end of element 776 connects to one end of both element 778 and element 782. The other end of element 778 further connects to one end of element 780. The other end of element 780 connects to ground. The other end of element 782 connects to one end of both element 784 and element 788. The other end of element 784 further connects to one end of element 786. The other end of element 786 connects to ground. The other end of element 788 connects to one end of element 790 and element 794 arranged in parallel as well as one end of element 796. The other end of element 790 further connects to one end of element 792. The other end of element 792 as well as the other end of element 784 connects to ground. The other end of element 796 provides an output for use with additional satellite broadcast receiving circuits.

Filter 700 includes modifications to enhance or improve the rejection of frequencies in the stopband of the filter components. In particular, filter 700 adds elements 746 and 752 to provide additional series resonant characteristics to augment rejection of FM broadcast signals. Further, the addition of element 722 provides additional rejection for MoCA signals that may be present in some systems (e.g., system 100 described in FIG. 1). The following table shows values for one exemplary embodiment of diplex filter 700.

TABLE 5

| ELEMENT | VALUE |
|---------|-------|
| 702 | 47 nanohenries |
| 704 | 220 picofarads |
| 710 | 16 nanohenries |
| 712 | 2.7 picofarads |
| 714 | 12 picofarads |
| 716 | 0.5 picofarads |
| 718 | 22 nanohenries |
| 720 | 3.3 picofarads |
| 722 | 1.5 picofarads |
| 724 | 12 nanhenries |
| 726 | 3.3 picofarads |
| 728 | 1.8 picofarads |
| 730 | 12 nanohenries |
| 732 | 2.2 picofarads |
| 734 | 12 nanohenries |
| 736 | 3.3 picofarads |
| 738 | 18 picofarads |
| 740 | 68 nanohenries |
| 742 | 68 picofarads |
| 744 | 10 picofarads |
| 746 | 100 nanhenries |
| 748 | 18 picofarads |
| 750 | 10 picofards |
| 752 | 100 nanohenries |
| 754 | 18 picofarads |
| 756 | 39 picofarads |
| 758 | Transmission Line Z0 = 60 ohms, length = 90 degrees |
| 760 | 5.6 ohms |
| 762 | 18 nanohenries |
| 764 | 2,200 picofarads |
| 770 | 1.5 picofarads |
| 772 | 220 picofarads |
| 774 | 3.6 nanohenries |
| 776 | 2.0 picofarads |
| 778 | 3.0 picofarads |
| 780 | 10 nanohenries |
| 782 | 3.3 picofarads |
| 784 | 2.0 picofarads |
| 786 | 16 nanohenries |
| 788 | 3.0 picofarads |
| 790 | 6.8 picofarads |
| 792 | 10 nanohenries |
| 794 | 0.8 picofarads |
| 796 | 1.8 nanohenries |

Figure 8:
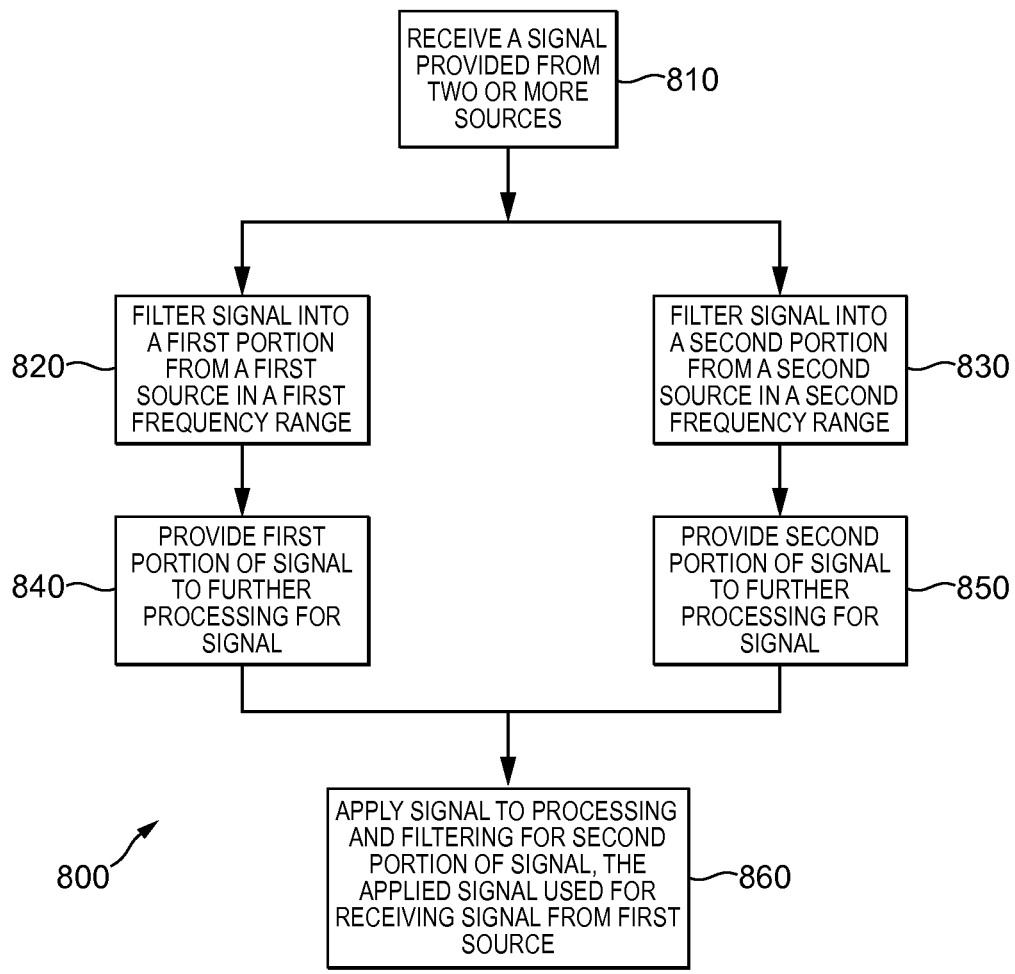
FIG. 8 is a flowchart showing an exemplary process for inserting electrical power into a filter circuit in accordance with the present disclosure.

Turning now to FIG. 8, a flowchart of an exemplary process 800 for inserting electrical power into a filter circuit in accordance with the present disclosure is shown. Process 800 will primarily be described with respect to diplex filter 200 described in FIG. 2. The steps of process 800 may equally apply to the diplex filter 600 in FIG. 6 or the diplex filter 700 in FIG. 7. Additionally, one or more of the steps in process 800 may be equally applicable to filter 103 in FIG. 1. Further, it is important to note that some of the steps described in process 800 may be implemented more than once, or may be implemented recursively. Such modifications may be made without any effect to the overall aspects of process 800.

At step 810, a signal is received at the input of a filter, such as diplex filter 200. The signal received, at step 810, may be comprised of different signals from a plurality of signal sources or service providers. The different signals may occupy different portions of the frequency spectrum or frequency ranges. The different signals are provided by one or more sources or service providers and represent broadcast audio and video programs and content arranged in channels. For example, a portion of the received signal in a high frequency range, such as 950 MHz to 2,150 MHz, may be delivered from one or more satellites and a portion of the received signal in a low frequency range, such as 170 MHz to 800 MHz, may be delivered from multiple television broadcast transmission sites.

At step 820, the received signal is filtered to separate the received signal into two or more portions or constituent signals. The filtering, at step 820, is performed by a set of filters arranged to form a diplex filter structure, such as diplex filter 200. Each filter in the diplex filter structure may include more than one type of filter and further may include split portions of filters arranged together. Diplex filter 200 includes two separate filter paths for separating or filtering the portions of the input signal based on frequency of the input signal. A highpass filter, such as highpass filter 210, is used to filter a first frequency range for the first portion of the received signal. A combination highpass filter and lowpass, such as highpass filter 220 and lowpass filter 230, is used to filter a second frequency range for the second portion of the received signal. The two filter paths are designed such that the frequency passbands of each do not overlap.

In a preferred embodiment, a highpass filter operates by passing a satellite signal in the range from 950 MHz to 2,150 MHz through to additional satellite signal receiving circuits and attenuating a cable or terrestrial broadcast signal operating in the frequency range from 170 MHz to 800 MHz. The combination highpass filter and lowpass filter portion passes the cable or terrestrial broadcast signal through to additional processing circuits while attenuating the satellite broadcast signal. Additionally, either filter path may able to pass data signals used in a local network (e.g., a MoCA network) through to addition processing circuits.

At step 830, the output signal from the first filter portion of the diplex filter structure is provided to a first signal processing circuit. The first signal processing circuit may containing a tuner, link circuit, and transport decoder for processing a signal in the first frequency range (e.g., tuner 105, link circuit 106, and transport decoder 108 described in FIG. 1). At step 840, the output signal from the second filter portion of the diplex filter structure is provided to a second signal processing circuit. The second signal processing circuit may containing a tuner, link circuit, and transport decoder for processing a signal in the second frequency range (e.g., tuner 110, link circuit 112, and transport decoder 114 described in FIG. 1). Each processing circuit may perform similar processing on the filtered signal streams, the processing being specific to the transmission protocol used.

At step 850, a signal is inserted into the second filter portion of the diplex filter structure. The inserted signal, at step 850, may include electrical power for an external device used to receive signals that are used for receiving the first portion of the input signal in the first frequency range (e.g., ODU 101 described in FIG. 1). The inserted signal, at step 850, may also include communication or control information for operating the external device. In one embodiment, the highpass filter 220 includes the connection for the electrical power and communication to the external outdoor receiving unit for the satellite signals. The values of one or more of the components in highpass filter 220 are designed such that the components can provide ESD and power surge protection while still properly operating as part of the filtering for the second frequency range (e.g., the cable or terrestrial broadcast signal from 170 MHz to 800 MHz). The value of the components are also chosen such that the components do not impact performance for the signals in the first frequency range filtered in highpass filter 210 (e.g., the satellite broadcast signal from 950 MHz to 2, 150 MHz). Inserting the signal using components as part of the second filter portion (e.g., highpass filter 220) instead of the first filter portion used for filtering the first frequency range overcomes the drawbacks presented earlier in interfacing electrical power for external devices in a multiplexing filter structure.

The present embodiments describe a method and apparatus for inserting electrical power into a filter. In particular, the embodiments describe a filter design that provides a connection for providing electrical power and signals to an external device. The electrical power and signals are used for operating an external device connected to a coaxial cable that is also used for receiving multiple services across multiple frequency bands, such as satellite signals and terrestrial broadcast signals. The embodiments describe a filter design used as part of a diplex filter structure. These structures are common in designs that must operate with and receive signals in separate frequency ranges or bands. The diplex filter separate the incoming signal into separate signal portions based on the frequency of the signal and further provides electrical power and low frequency communication signals to components (e.g., low noise block converters) connected external to the device.

The diplex filter structures described in the embodiments herein include a first portion that is a highpass filter for operation in a first frequency (e.g., satellite L-band frequency) range. The embodiments include a second portion that is operates as a bandpass filter for a second frequency (e.g., television frequency) range. The bandpass filter is constructed as a combination of a highpass filter and a lowpass filter. The additional insertion circuit for electrical power and communication signals used to operate a circuit associated with the first frequency range is incorporated into a first section of the highpass filter for the second frequency range bandpass filter. Further, a portion of the highpass filter may also be positioned or electrically connected following the lowpass filter in the bandpass structure.

Although embodiments which incorporate the teachings of the present disclosure have been shown and described in detail herein, those skilled in the art can readily devise many other varied embodiments that still incorporate these teachings. Having described preferred embodiments of a method and apparatus for applying signals into a filter circuit (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

What is claimed is:

1. An apparatus comprising:
a first filter circuit that filters an input signal received at the input of the first filter, the input signal containing media program content that is received from a satellite signal service provider and media program content that is received from at least one of a terrestrial signal service provider and a cable signal service provider, the first filter circuit outputting a first output signal that is a portion of the input signal in a first frequency range; and
a second filter circuit, the input of the second filter circuit coupled to the input of the first filter circuit, the second filter circuit including a highpass filter and a lowpass filter, the highpass filter including a first portion and a remaining portion, the first portion coupled in series between the input of the first filter circuit and the input of the lowpass filter and the remaining portion coupled in series to the output of the lowpass filter, the highpass filter and low pass filter filtering the input signal and the output of the remaining portion of the highpass filter outputting a second output signal that is a portion of the input signal in a second frequency range, the second frequency range being different than the first frequency range, wherein the second filter circuit includes an interface circuit for inserting a signal that is provided to a device used to receive the portion of the input signal in the first frequency range.

2. The apparatus of claim 1, wherein the first frequency range is above the second frequency range.

3. The apparatus of claim 2, wherein the first frequency range is 950 Megahertz to 2,150 Megahertz and the second frequency range is 170 Megahertz to 800 Megahertz.

4. The apparatus of claim 1, wherein the interface circuit is included as part of the first portion of the highpass filter.

5. The apparatus of claim 1, wherein the interface circuit is used to supply at least one of electrical power, communication signals, and control signals to the device used to receive the portion of the input signal in the first frequency range.

6. The apparatus of claim 1, wherein the interface circuit is further used to connect at least one of a surge protection device and an electrostatic discharge protection device.

7. The apparatus of claim 1, wherein the device used to receive the portion of the input signal in the first frequency range is external to the apparatus.

8. The apparatus of claim 1, wherein the portion of the input signal in the first frequency range contains the media program content that is received from a satellite signal service provider and the portion of the input signal in the second frequency range contains the media program content that is received from at least one of a terrestrial signal service provider and a cable signal service provider.

9. The apparatus of claim 1, wherein at least one of the first filter circuit and the second filter circuit also filters a signal used in a multimedia over cable alliance network.

10. A method comprising:
providing first filtering, using a first filter circuit, for an input signal received at the input of the first filter circuit, the input signal containing media program content that is received from a satellite signal service provider and media program content that is received from at least one of a terrestrial signal service provider and a cable signal service provider, the filtering further outputting a first output signal that is a portion of the input signal in a first frequency range; and
providing second filtering, using a second filter circuit, for the input signal, the input signal also received at the input of the second filter circuit, the second filter circuit including a highpass filter and a lowpass filter, the highpass filter including a first portion and a remaining portion, the first portion coupled in series between the input of the first filter circuit and the input of the lowpass filter and the remaining portion coupled in series to the output of the lowpass filter, the output of the remaining portion of the highpass filter further outputting a second output signal that is a portion of the input signal in a second frequency range, the second frequency range being different than the first frequency range, wherein the second filter circuit includes an interface circuit for inserting a signal that is provided to a device used to receive the portion of the input signal in the first frequency range.

11. The method of claim 10, wherein the first frequency range is above the second frequency range.

12. The method of claim 11, wherein the first frequency range is 950 Megahertz to 2,150 Megahertz and the second frequency range is 170 Megahertz to 800 Megahertz.

13. The method of claim 10, wherein the interface circuit is included as part of the first portion of the highpass filter.

14. The method of claim 10, wherein the interface circuit is used to supply at least one of electrical power, communication signals, and control signals to the device used to receive the portion of the input signal in the first frequency range.

15. The method of claim 10, wherein the interface circuit is further used to connect at least one of a surge protection device and an electrostatic discharge protection device.

16. The method of claim 10, wherein the device used to receive the portion of the input signal in the first frequency range is external to the apparatus.

17. The method of claim 10, wherein the portion of the input signal in the first frequency range contains the media program content that is received from a satellite signal service provider and the portion of the input signal in the second frequency range contains the media program content that is received from at least one of a terrestrial signal service provider and a cable signal service provider.

18. The method of claim 10, wherein at least one of the first filter circuit and the second filter circuit also filters a signal used in a multimedia over cable alliance network.

* * * * *